United States Patent
Choi et al.

(10) Patent No.: US 8,416,617 B2
(45) Date of Patent: Apr. 9, 2013

(54) SEMICONDUCTOR DEVICE, SEMICONDUCTOR SYSTEM HAVING THE SAME, AND METHOD FOR OPERATING THE SEMICONDUCTOR DEVICE

(75) Inventors: Joon-Yong Choi, Gwacheon-si (KR); Hoi Ju Chung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 203 days.

(21) Appl. No.: 13/073,021

(22) Filed: Mar. 28, 2011

(65) Prior Publication Data

US 2011/0261615 A1 Oct. 27, 2011

(30) Foreign Application Priority Data

Apr. 26, 2010 (KR) .......................... 10-2010-0038246

(51) Int. Cl.
*G11C 11/00* (2006.01)
(52) U.S. Cl. ..................... 365/163; 365/189.07; 365/148
(58) Field of Classification Search ................... 365/163, 365/148, 189.07
See application file for complete search history.

(56) References Cited

U.S. PATENT DOCUMENTS

| | | | | |
|---|---|---|---|---|
| 7,336,544 | B2* | 2/2008 | Takemura | 365/189.08 |
| 7,463,502 | B2* | 12/2008 | Stipe | 365/65 |
| 7,505,330 | B2 | 3/2009 | Pawlowski et al. | |
| 8,134,866 | B2* | 3/2012 | Bae et al. | 365/163 |
| 8,289,786 | B2* | 10/2012 | Huang et al. | 365/189.14 |
| 2009/0040816 | A1 | 2/2009 | Kang et al. | |
| 2009/0237979 | A1 | 9/2009 | Mukai et al. | |
| 2011/0280065 | A1* | 11/2011 | Rao et al. | 365/171 |

FOREIGN PATENT DOCUMENTS

| | | |
|---|---|---|
| JP | 2009230796 A | 10/2009 |
| KR | 1020090016187 A | 2/2009 |
| KR | 1020090035608 A | 4/2009 |

* cited by examiner

*Primary Examiner* — Tuan T. Nguyen
(74) *Attorney, Agent, or Firm* — Volentine & Whitt, PLLC

(57) ABSTRACT

A semiconductor device includes phase-change memory cells and an access circuit. The access circuit generates a plurality of bitwise comparison signals indicating different comparison events for respective write and read bit groups. At least a portion of the write data is then written to the phase-change memory cells according to a number of activated comparison signals for each comparison event, as well as according to a ratio of a set current pulse width and a reset current pulse width as applied to the of phase-change memory cells.

17 Claims, 6 Drawing Sheets

FIG. 5

| | DATA | | | | | | | | PARITY | # OF CELLS | WRITE TIME |
|---|---|---|---|---|---|---|---|---|---|---|---|
| READ_DATA | 0 | 0 | 1 | 1 | 1 | 1 | 0 | 1 | 0 | — | — |
| WRITE_DATA | 0 | 0 | 0 | 0 | 0 | 1 | 0 | 0 | 0 | — | — |
| NORMAL WRITE | X | X | 0 | 0 | 0 | X | 0 | 0 | X | 5 | 2.6μs |
| DCWP(INVERTED) | 1 | 1 | X | X | X | 0 | X | X | 1 | 4 | 3.4μs |
| DCWP(Non-Inverted) | X | X | 0 | 0 | 0 | X | 0 | 0 | X | 5 | 2.6μs |

X : No Writing Operation
RESET TIME : 400ns
SET TIME : 1μs

SEMICONDUCTOR DEVICE, SEMICONDUCTOR SYSTEM HAVING THE SAME, AND METHOD FOR OPERATING THE SEMICONDUCTOR DEVICE

CROSS-REFERENCE TO RELATED APPLICATIONS

This application claims priority under 35 U.S.C. §119 to Korean Patent Application No. 10-2010-0038246 filed on Apr. 26, 2010, the subject matter of which is hereby incorporated by reference.

BACKGROUND OF THE INVENTION

The inventive concept relates to semiconductor devices, and more particularly to semiconductor devices capable of improving data write speeds using a defined ratio between a set current pulse width and a reset current pulse width. The inventive concept also relates to semiconductor systems incorporating this type of semiconductor device, as well as methods of operating this type of semiconductor device.

Conventional random access memory (RAM) devices are characterized in one aspect by a similarity in read speed and write speed. However, this is generally not the case for certain types of nonvolatile memory devices, such as phase-change memory devices. Indeed many nonvolatile memory devices are characterized by a relatively slower write speed, as compared to read speed.

SUMMARY OF THE INVENTION

Embodiments of the inventive concept provide a semiconductor device (and a semiconductor system incorporating same) capable of improving write speed by considering both a ratio between a set current pulse width and a reset current pulse width and a number of comparison signals indicating comparison events between bitwise compared write bit groups and corresponding read bit groups. Embodiments of the inventive concept also provide methods of operating this type of semiconductor device.

In one embodiment, the inventive concept provides a semiconductor device comprising; phase-change memory cells arranged in a memory cell array; and an access circuit. The access circuit receives k bits of read data from the phase-change memory cells and k bits of externally provided write data, and is configured to bitwise compare the write data and read data, wherein each bitwise comparison activates one or more comparison signals respectively indicating one of a plurality of comparison events, and write j bits of write data, where j≦k, to the phase-change memory cells in accordance with a number of the activated comparison signals and a S/N ratio calculated as a ratio between of a set current pulse width and a reset current pulse width applied to the phase-change memory cells.

In a related aspect, the access circuit may comprise; a plurality of comparison units, respectively making a bitwise comparison between a write bit group from the write data and a read bit group from the read data, and activating one or more of the plurality of comparison signals in accordance with the bitwise comparison.

In another related aspect, each of the plurality of comparison units may comprise; a first inverter inverting the write bit group to generate an inverted write bit group, an exclusive OR circuit performing an exclusive OR operation on the read bit group and the write bit group to generate an exclusive OR output, a second inverter inverting the exclusive OR output to generate an inverted exclusive OR output, a first logic circuit comparing the inverted exclusive OR output to the write bit group to generate a first comparison signal, a second logic circuit comparing the inverted exclusive OR output to the inverted write bit group to generate a second comparison signal, a third logic circuit comparing the exclusive OR output to the write bit group to generate a third comparison signal, and a fourth logic circuit comparing the exclusive OR output to the inverted write bit group to generate a fourth comparison signal.

In another related aspect, the plurality of comparison units comprises a first, second, third and fourth comparison unit, and the access circuit comprises a decision unit, wherein the decision unit comprises; first, second, third, and fourth counters respectively configured to count a number of activated comparison signals provided from the first, second, third and fourth comparison units and generate first, second, third, and fourth count values, a first multiplier multiplying the second count value by the S/N ratio to generate a first weighted count value, a second multiplier multiplying the third count value by the S/N ratio to generate a second weighted count value, a first adder adding the first count value to the first weighted count value to generate a first summed count value, a second adder adding the fourth count value to the second weighted count value to generate a second summed count value, and a comparator comparing the first and second summed count values to generate a selection signal.

In another related aspect, the access circuit may further comprise; a plurality of write drivers configured to write the k bits of write data to the phase-change memory cells, and a plurality of selection blocks, each generating an enable/disable signal applied to a respective one of the plurality of write drivers, wherein j selection block from among the plurality of selection blocks are enabled to write the j bits of write data in response to the number of activated comparison signals, the S/N ratio, and the selection signal.

In another related aspect, the access circuit may further comprise in association with each one of the plurality of comparison units; a first multiplexer providing either the first comparison signal or the second comparison signal in response to the selection signal as a first multiplexer output, a second multiplexer providing either the third comparison signal or the fourth comparison signal in response to the selection an output signal of the comparator as a second multiplexer output; and a third multiplexer providing either the first multiplexer output or the second multiplexer output as an enable/disable signal applied to a corresponding one of the plurality of write drivers.

In another embodiment, the inventive concept provides a method for operating a semiconductor device, the method comprising; generating a plurality of bitwise comparison signals indicating different comparison events between respective write bit groups of externally provided write data and read bit groups of read data read from phase-change memory cells, and writing a portion of the write data to some of the phase-change memory cells in accordance with a number of activated comparison signals and a S/N ratio calculated by a ratio of a set current pulse width and a reset current pulse width applied to the phase-change memory cells.

BRIEF DESCRIPTION OF THE DRAWINGS

Exemplary embodiments of the inventive concept will be more clearly understood from the following detailed description taken in conjunction with the accompanying drawings in which:

FIG. 5 is a table listing certain exemplary operative characteristics and features of the semiconductor device of FIG. 1.

DETAILED DESCRIPTION

The attached drawings which illustrate certain embodiments of the inventive concept may be referred to in order to gain a sufficient understanding of the inventive concept and the merits thereof. Hereinafter, the inventive concept will be described in some additional detail with reference to the attached drawings. Throughout the written description and drawings, like reference numbers and labels denote like or similar elements.

Figure 1:
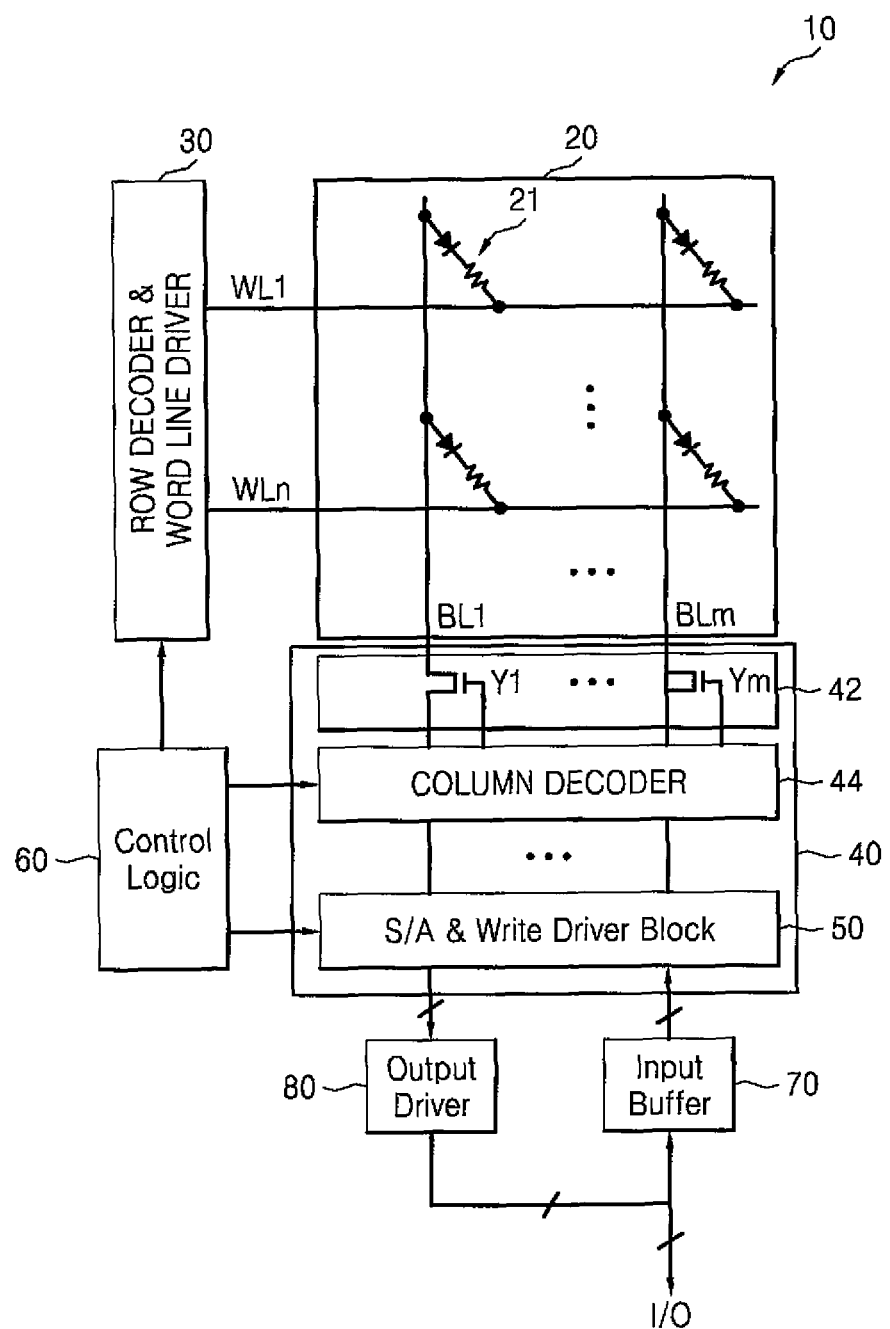
FIG. 1 is a block diagram of a semiconductor device according to an embodiment of the inventive concept.

FIG. 1 is a block diagram of a semiconductor device 10 according to an embodiment of the inventive concept. Referring to FIG. 1, the semiconductor device 10 comprises a memory cell array 20, a row decoder & word line driver 30, an access circuit 40, a control logic 60, an input buffer 70, and an output driver 80.

The memory cell array 20 includes a plurality of word lines WL1-WLn, where "n" is a natural number, a plurality of bit lines BL1-BLm, where "m" is a natural number, and a plurality of phase-change memory cells 21.

The row decoder & word line driver 30, in response to a plurality of row addresses and control signal provided by the control logic 60 selects one of the word lines WL1-WLn and applies at least one operating voltage to a selected word line. For example, during a program (or write operation) the at least one operating voltage may be a program operation or a write operation, and during a read operation the operating voltage may be a read voltage.

The access circuit 40, in response to a plurality of column addresses and control signals provided by the control logic 60, controls the generation of a "read" plurality of bitwise comparison signals indicating various data states for memory cells in the memory cell array 20, or the generation of a "write" plurality of bitwise comparison signals indicating data states for write data to be written to memory cells in the memory cell array 20. In this context, the term "bitwise" denotes read/write data bit or bit line by bit line (or bit line group by bit line group) approach to the reading, writing (programming), and/or comparison of data in relation to the memory cells of the memory cell array 20. In the more specific context of a phase-change memory 10 incorporating a memory cell array 20 of phase-change memory cells 21, the plurality of bitwise comparison signals may be generated by a bitwise comparison of write data (i.e., data to be written to the memory cell array 20 with existing (i.e., already programmed) data output from the memory cell array 20. In response to this plurality of bitwise comparison signals, a written operation may include writing only a portion of the write data to corresponding "activated" phase-change memory cells 21. A particular phase-change memory cell becomes activated during a write operation in accordance with a bitwise comparison signal and a ratio (hereinafter, referred to as the "set-to-reset (S/R) ratio") of a pulse width of a set current (or a set voltage) and a pulse width of a reset current (or a reset voltage) as supplied to the phase-change memory cells 21.

The foregoing expression "a portion of the write data" denotes either a number of write data bits in the write data or a number of inverted data bits in the write data. That is, the access circuit 40 may control a write operation (or program operation) in relation to a defined set of write data bits, and may also control a read operation in accordance with the sensed (and amplified) data states of the phase-change memory cells 21 in the memory cell array 20.

In the illustrated embodiment of FIG. 1, the access circuit 40 generally comprises a column selection circuit 42, a column decoder 44, and a sense amplifier (S/A) & write driver block 50. The column selection circuit 42, which may be referred to as a gating circuit, includes a plurality of switches configured to connect any one column of the bit lines BL1-BLm and the S/A & write driver block 50 in response to at least one activated signal of a plurality of column selection signals Y1-Ym output from the column decoder 44. The column decoder 44 may decode the column addresses output from the control logic 60 and selectively activate at least one of the column selection signals Y1-Ym according to a result of the decoding.

During a write operation (or program operation), the S/A & write driver block 50, in response to a plurality of first control signals output from the control logic 60, may write the write data input through the input buffer 70 to at least one of the phase-change memory cells 21 of the memory cell array 20, as selected by the row decoder & word line driver 30 and the column decoder 44, according to a set current pulse or a reset current pulse.

During a read operation, the S/A & write driver block 50, in response to a plurality of second control signals output from the control logic 60, may sense and amplify the data stored in at least one of the phase-change memory cells 21 of the memory cell array 20, which is selected by the row decoder & word line driver 30 and the column decoder 44, and transmit amplified data to the output driver 80. The output driver 80 may transmit the data output from the S/A & write driver block 50 to a plurality of input/output (I/O) lines.

Figure 2:
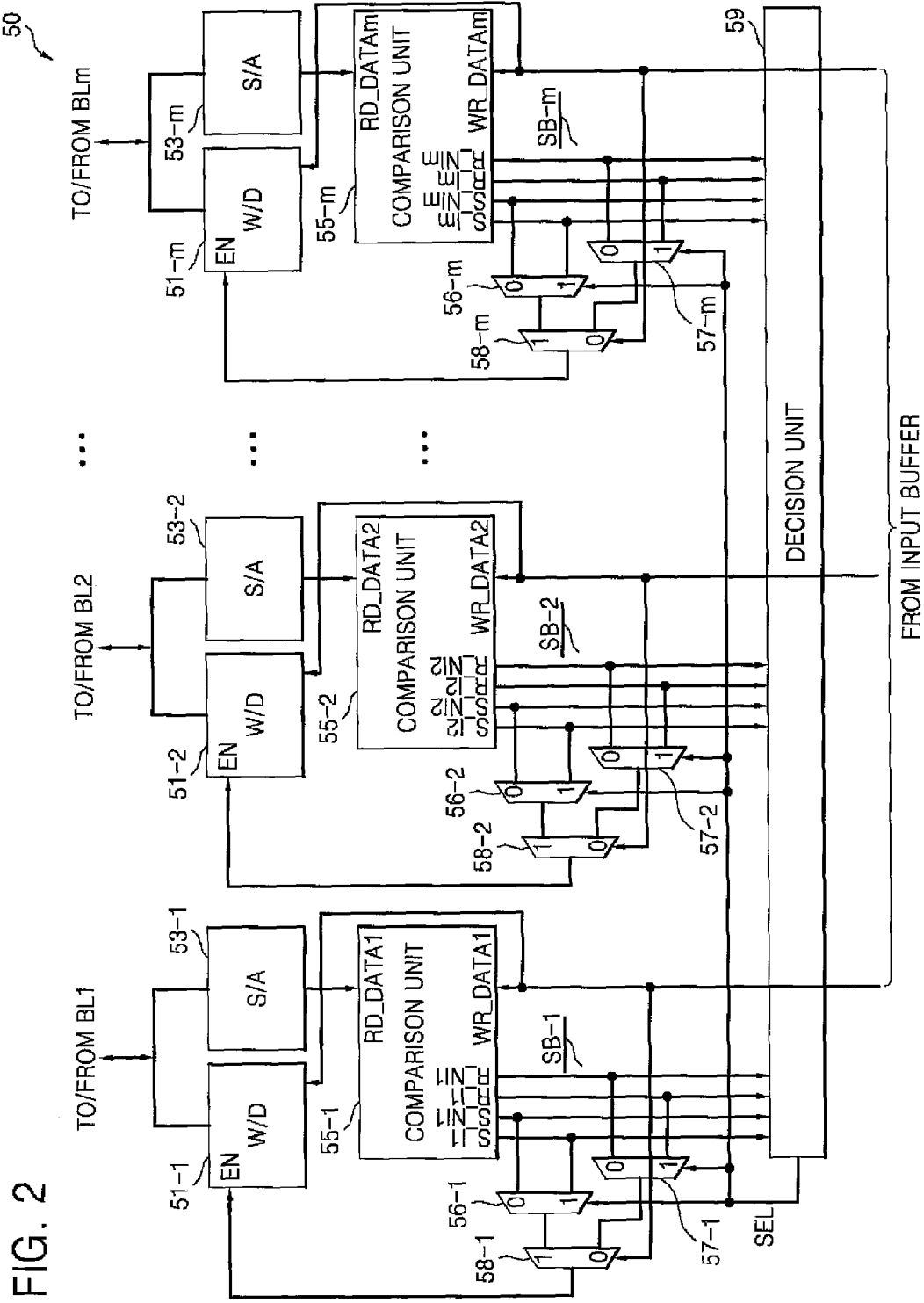
FIG. 2 is a block diagram further illustrating the sense amplifier and write driver block of FIG. 1.

FIG. 2 is a block diagram further illustrating the S/A & write driver block 50 of FIG. 1. Referring to FIGS. 1 and 2, the S/A & write driver block 50 comprises a plurality of write drivers (W/D) 51-1, 51-2, . . . , 51-m, a plurality of sense amplifiers (S/A) 53-1, 53-2, . . . , 53-m, a plurality of comparison units 55-1, 55-2, . . . , 55-m, a plurality of selection blocks (SB) SB-1, SB-2, . . . , SB-m, and a decision unit 59. Each of the write drivers 51-1, 51-2, . . . , 51-m are enabled/disabled in response to an output signal output from each of the selection blocks SB-1, SB-2, . . . , SB-m, for example, an enable signal.

During the write operation (or program operation), each of the enabled write drivers 51-1, 51-2, . . . , 51-m supplies a set current pulse (or a set voltage pulse) or a reset current pulse (or a reset voltage pulse) to each of the bit lines BL1, BL2, . . . , BLm, to write (or program) write data to a corresponding one of the phase-change memory cells 21 of the memory cell array 20. During the read operation, each of the sense amplifiers 53-1, 53-2, . . . , 53-m senses and amplifies the data output from each of the bit lines BL1, BL2, . . . , BLm.

Each of the comparison units 55-1, 55-2, . . . , 55-m make a bitwise comparison of the write data with the read data (i.e., currently stored data) output from the phase-change memory cells 21 and generates a plurality of bitwise comparison signals S_I1~S_Im, S_NI1~S_NIm, R_I1~R_Im, and R_NI1~R_NIm respectively indicating the comparison conditions (i.e., a logic comparison value indicating a positive or negative comparison relationship between the write data and stored memory cell data).

For example, the first comparison unit 55-1 may compare a first write bit group WR_DATA1 (where the first write bit group comprises 1 or more data bits of write data) to be written to a first memory cell connected to the first bit line BL1 with a first read bit group RD_DATA1 read from the first memory cell according to its current programmed state. For example, the first write bit group may be a single data bit corresponding to a least significant bit (LSB) of first write data to be written to the first memory cell, and the first read bit group may be a single data bit corresponding to the a LSB of first read data already stored in the first memory cell.

As a result of this comparison, the first comparison unit 55-1 generates a first set of comparison signals S_I1, S_NI1, R_I1, and R_NI1 indicating different "comparison events" associated with different comparison relationships between the first write bit group WR_DATA1 and the first read bit groups RD_DATA1. In the illustrated embodiment of FIG. 2, each one of the "m" comparison units 51-1 through 51-m compares a single write data bit (WR) with a single read (RD) data bit in an arrangement of LSB of write data to most significant bit (MSB) of write data, where the whole comparative set of write data and read data includes "m" bits. Yet, this need not be the case, and other embodiments of the inventive concept may include comparison units 51-1 through 51-m comparing multiple bits of write and read data according to defined write and read but groups.

The decision unit 59 is configured to generate a selection signal SEL according to the comparison signals S_I1~S_Im, S_NI1~S_NIm, R_I1~R_Im, and R_NI1~R_NIm output from the plurality of comparison units 55-1, 55-2, . . . , 55-m, and a ratio of a set current pulse width and a reset current pulse width, that is, an S/N ratio.

Each of the selection blocks SB-1, SB-2, . . . , SB-m outputs a corresponding output signal to enable/disable respective one of the write drivers 51-1, 51-2, . . . , 51-m. In the illustrated embodiment of FIG. 2, each of the selection blocks SB-1, SB-2, . . . , SB-m includes a plurality of first multiplexers 56-1, 56-2, . . . , 56-m, a plurality of second multiplexers 57-1, 57-2, . . . , 57-m, and a plurality of third multiplexers 58-1, 58-2, . . . , 58-m.

Each of the first multiplexers 56-1, 56-2, . . . , 56-m is configured to receive as inputs a first plurality of comparison signals from a corresponding comparison unit 51-1, 51-2, . . . , 51-m and the gating selection signal SEL from the decision unit 59, and provide a first multiplexer output signal. Each of the second multiplexers 57-1, 57-2, . . . , 57-m is configured to receive as inputs a second plurality of comparison signals from the corresponding comparison unit 51-1, 51-2, . . . , 51-m and the gating selection signal SEL from the decision unit 59, and provide a second multiplexer output signal. Each of the third multiplexers 58-1, 58-2, . . . , 58-m is configured to receive as inputs the first and second multiplexer signal outputs and provide an enable/disable signal to a corresponding write driver W/D.

Figure 3:
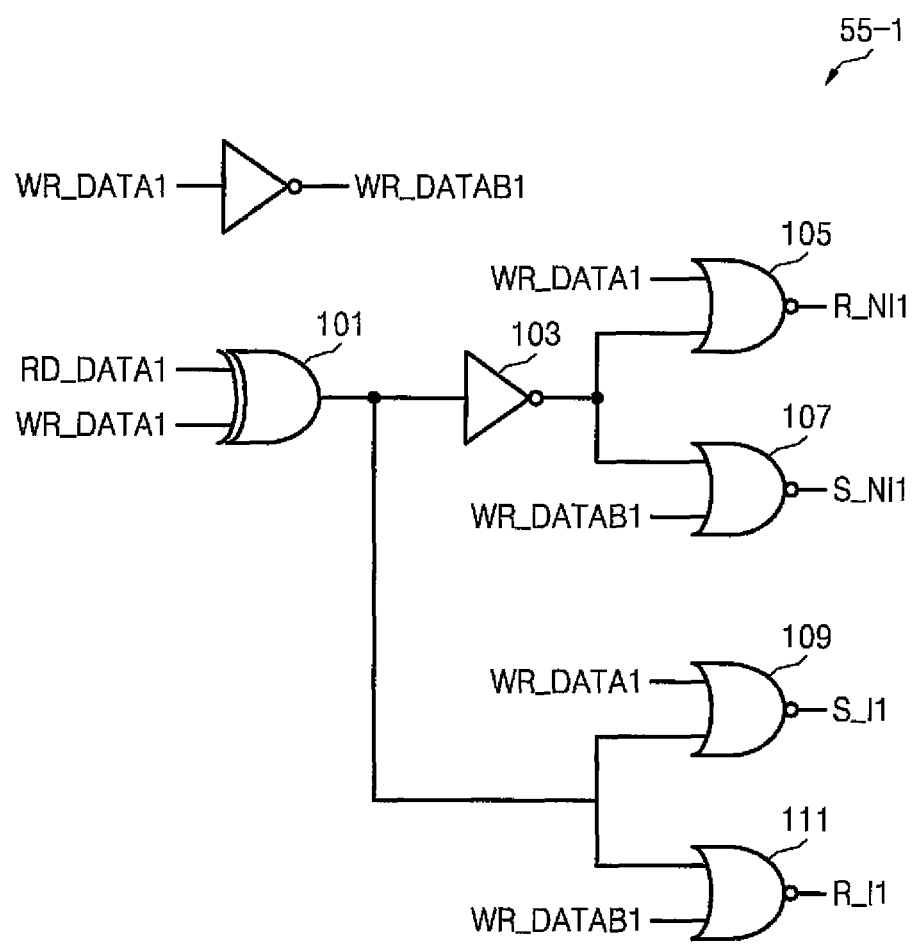
FIG. 3 is a logic diagram further illustrating the first comparison unit of FIG. 2.

FIG. 3 is a logic diagram further illustrating one possible example of circuitry that may be used to implement the first comparison unit 55-1 of FIG. 2. Since the structures of the comparison units 55-1, 55-2, . . . , 55-m are the same, the structure and operation of the first comparison unit 55-1 will be described below while descriptions on the other comparison units 55-2~55-m will be omitted herein.

The first comparison unit 55-1 comprises an exclusive OR circuit 101, an inverter 103, and a plurality of NOR gate circuits 105, 107, 109, and 111. The exclusive OR circuit 101 performs an exclusive OR operation on the first write bit group WR_DATA1 of the write data and the first read bit group RD_DATA1 of the read data. The inverter 103 inverts an output signal of the exclusive OR circuit 101.

The first NOR gate circuit 105 then performs a NOR operation on the first write bit group WR_DATA1 and the output signal of the inverter 103 to generate a first comparison signal R_NI1 indicating a first comparison event (e.g., a non-inverted reset event). The second NOR gate circuit 107 performs a NOR operation on an inverted version of the first write bit group WR_DATAB1 and the output signal of the inverter 103 to generate a second comparison signal S_NI1 indicating a second comparison event (e.g., a non-inverted set event).

The third NOR gate circuit 109 performs a NOR operation on the output signal of the exclusive OR circuit 101 and the first write bit group WR_DATA1 to generate a third comparison signal S_I1 indicating a third comparison event (e.g., an inverted set event). The fourth NOR gate circuit 111 performs a NOR operation on the output signal of the exclusive OR circuit 101 and the inverted version of the first write bit group WR_DATAB1 to generate a fourth comparison signal R_I1 indicating a fourth comparison event (e.g., an inverted reset event).

Figure 4:
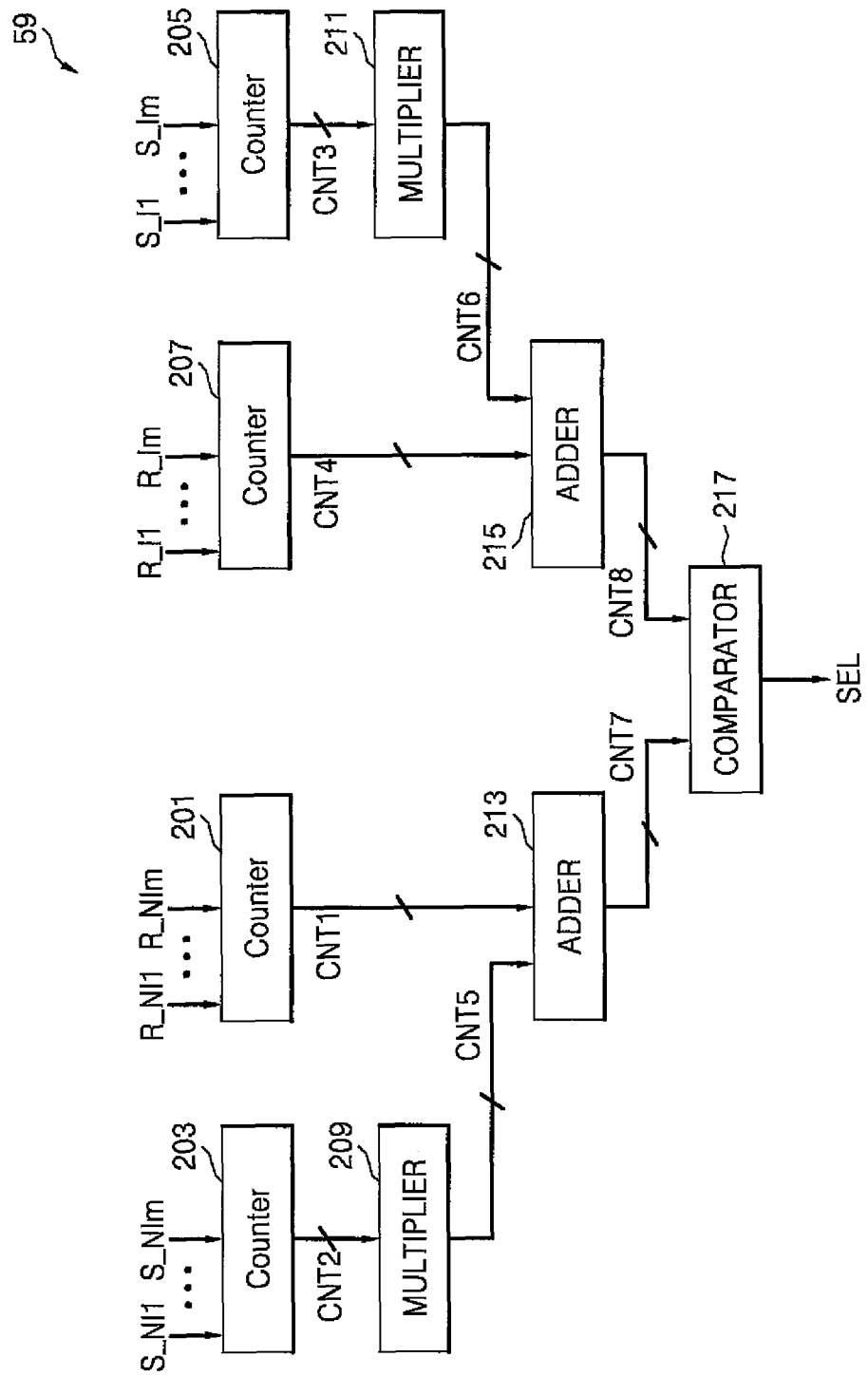
FIG. 4 is a block diagram further illustrating the decision unit of FIG. 2.

FIG. 4 is a block diagram further illustrating one possible implementation example for the decision unit 59 of FIG. 2. Referring to FIG. 4, the decision unit 59 comprises a plurality of counters 201, 203, 205, and 207, a plurality of multipliers 209 and 211, a plurality of adders 213 and 215, and a comparator 217.

The first counter 201 counts a number of activated first comparison signal(s) from the first set of comparison signals R_NI1~R_NIm provided by the first comparison units 55-1 to generate a first count value CNT1. The second counter 203 through fourth counter 205 (or the "m$^{th}$" counter in the illustrated embodiment) similarly generates respective count values CNT2, CNT3 and CNT4 from corresponding, activated comparison signals. Each of the first count value CNT1 through fourth count value CNT4 may include a plurality of bits.

The first multiplier 209 generates a fifth (or weighted) count value CNT5 by multiplying the second count value CNT2 by the S/R ratio. For example, when a number obtained by multiplying the second count value CNT2 and the S/R ratio is a fraction number, the first multiplier 209 may generate the fifth count value CNT5 that is a natural number by rounding off a result of the multiplication. The second multiplier 211 similarly generates a sixth (or weighted) count value CNT6 by multiplying the third count value CNT3 by the S/R ratio. For example, when a number obtained by multiplying the third count value CNT3 and the S/R ratio is a fraction number, the second multiplier 211 may generate the six count value CNT6 that is a natural number by rounding off a result of the multiplication.

The first adder 213 then adds the first count value CNT1 and the fifth count value CNT5, (e.g., in a bitwise manner) to generate a seventh (or summed) count value CNT7. The second adder 215 similarly bitwise adds the fourth count value CNT4 and the sixth count value CNT6 to generate an eighth (or summed) count value CNT8.

The comparator 217 then compares the summed count values CNT7 and CNT8 to generate the selection signal SEL. In certain embodiments of the inventive concept, the selection signal SEL may be a 1-bit selection signal. When the comparator 217 outputs a logically high ("high") selection signal SEL, inversion may be selected. When the comparator 217 outputs logical low ("low") selection signal SEL, non-inversion may be selected.

FIG. 5 is a table listing certain exemplary operating conditions and features according to the semiconductor device 10 of FIG. 1. Referring to FIGS. 1-5, when the read data (READ_DATA) stored in selected memory cells 21 of the memory cell array 20 is "00111101" and the write data (WRITE_DATA) to be written to the selected memory cells 21 is "00001010" during a normal write operation (NORMAL_WRITE), the access circuit 40 makes a bitwise comparison of the data (READ_DATA) and the write data (WRITE_DATA) and then controls the execution of a bitwise write operation for the write data (WRITE_DATA) on the basis of the bitwise comparison results.

For example, as a result of the bitwise comparison between the read data (READ_DATA) and the write data (WRITE_DATA), it is noted that the $1^{st}$, $2^{nd}$, and $5^{th}$ respective bits are the same and all other bits are different. It is further assumed for purposes of illustration that a reset time (i.e., the time required to write a data value of "0" to a phase-change memory cell array 21) is 400 ns and a set time (i.e., the time required to write a data value of "1") is 1 μs. Thus, in the illustrated example of FIG. 5, the time required to write the 5 "new" data values to the memory cell array 20 may be assumed to be about 2.6 μs (i.e., 400 ns×4+1 μs).

However, when the access circuit 40 bitwise compares inverted write data "11110101" generated by bitwise inverting the write data (WRITE_DATA) "00001010" with the read data (READ_DATA) and performs a write operation for the resulting comparison data (i.e., data compared write with parity (DCWP) INVERTED) according to a result of the comparison, the access circuit 40 may write three data and a parity bit PARITY indicating the inversion of the write data (WRITE_DATA) "00001010" to the memory cell array 20. The resulting write time required to write four data bits to the memory cell array 20 may be assumed to be 3.4 is (i.e., 400 ns+3×1 μs).

Referring to FIG. 5, a number (5) of memory cells that must be over-written during a normal write operation (NORMAL_WRITE) is greater than a number (4) of memory cells that must be over-written during an inverted write operation (DCWP INVERTED). However, consideration of the respective write times required to execute the normal write operation verses the inverted write operation reveals that the normal write operation time will be less than the inverted write operation time.

In view of the outcome, the access circuit 40 according to the embodiment of the inventive concept is capable of selecting between different versions of a particular write operation not only in relation to the number of effected memory cells (i.e., memory cells that must be overwritten during the write operation), but also the expected write times associated with the different versions of the particular write operation.

Thus, the operation of the semiconductor device 10 designed and operated in accordance with embodiments of the inventive concept has been described with reference to FIGS. 1 through 5. As specifically illustrated in FIG. 5, when write data (WRITE_DATA) is assumed to be "00001010" and corresponding read data (READ_DATA) is assumed to be "00111101", each one of comparison units 55-1, 55-2, ..., 55-m (where "m" is 8 in the illustrated example, since each comparison unit considers only a single bit) then performs a bitwise comparison of the write data with the read data.

As illustrated in FIG. 3, when a resulting write/read bit pair (0,0) is compared, an inverted set event (or third) comparison signal S_Ix, where 1≦x≦8, is activated. When a write/read bit pair (0,1) is compared, a non-inverted set event (or second) comparison signal S_NIx, where 1≦x≦8, is activated. When a write/read bit pair (1,0) is compared, a non-inverted reset event (or first) comparison signal R_NIx, where 1≦x≦8, is activated. And when a write/read bit pair (1,1) is compared, an inverted reset event (or fourth) comparison signal R_Ix, where 1≦x≦8, is activated.

As illustrated in the embodiment of FIG. 4, the first count value CNT1 of the first counter 201 is 4. The second count value CNT2 of the second counter 203 is 1. The third count value CNT3 of the third counter 205 is 2. The fourth count value CNT4 of the fourth counter 207 is 1. When an S/R ratio stored in each of the first and second multipliers 209 and 211 is 2.5, the first multiplier 209 outputs 3 obtained by rounding off 2.5 (=1×2.5) as the fifth count value CNT5 and the second multiplier 211 outputs 5 (=2×2.5) as the sixth count value CNT6.

The first adder 213 outputs 7 as the seventh count value CNT7, whereas the second adder 215 outputs 6 as the eighth count value CNT8. Thus, when the seventh count value CNT7 is input to a (−) input terminal of the comparator 217 and the eighth count value CNT8 is input to a (+) input terminal of the comparator 217, the comparator 217 outputs a low selection signal SEL.

Thus, each of the first multiplexers 56-1, 56-2, ..., 56-m and each of the second multiplexers 57-1, 57-2, ..., 57-m, in response to the low selection signal SEL, outputs an output signal of a first input terminal (0) to each of the third multiplexers 58-1, 58-2, ..., 58-m. Each of the third multiplexers 58-1, 58-2, ..., 58-m, in response to each bit of the write data (WRITE_DATA) may enable/disable each of the write drivers 51-1, 51-2, ..., 51-m. For example, each of the write drivers 51-1, 51-2, ..., 51-m may be enabled in response to a high output signal of each of the third multiplexers 58-1, 58-2, ..., 58-m, and disabled in response to a low output signal of each of the third multiplexers 58-1, 58-2, ..., 58-m.

The access circuit 40 according to the embodiments of the inventive concept may write a portion of write data to the memory cell array 20 in accordance with a number of activated comparison signals related to a number of comparison events as well as a ratio of a set current (or set voltage) pulse width and a reset current (or reset voltage) pulse width supplied to the phase-change memory cells 21 of the memory cell array 20, that is, an S/R ratio.

That is, the access circuit 40 may perform a write operation for only a portion of the write data in relation to existing read data stored in the memory cell array 20 upon specific consideration of the S/R ratio and both a normal write operation and an inverted write operation, and more particularly the expected amount of time required to execute same. In this manner, semiconductor devices according to certain embodiments of the inventive concept may improve write data speed because write operations are performed in view of expected write time, not just the expected number of memory cells that must be overwritten during the write operation.

Figure 6:
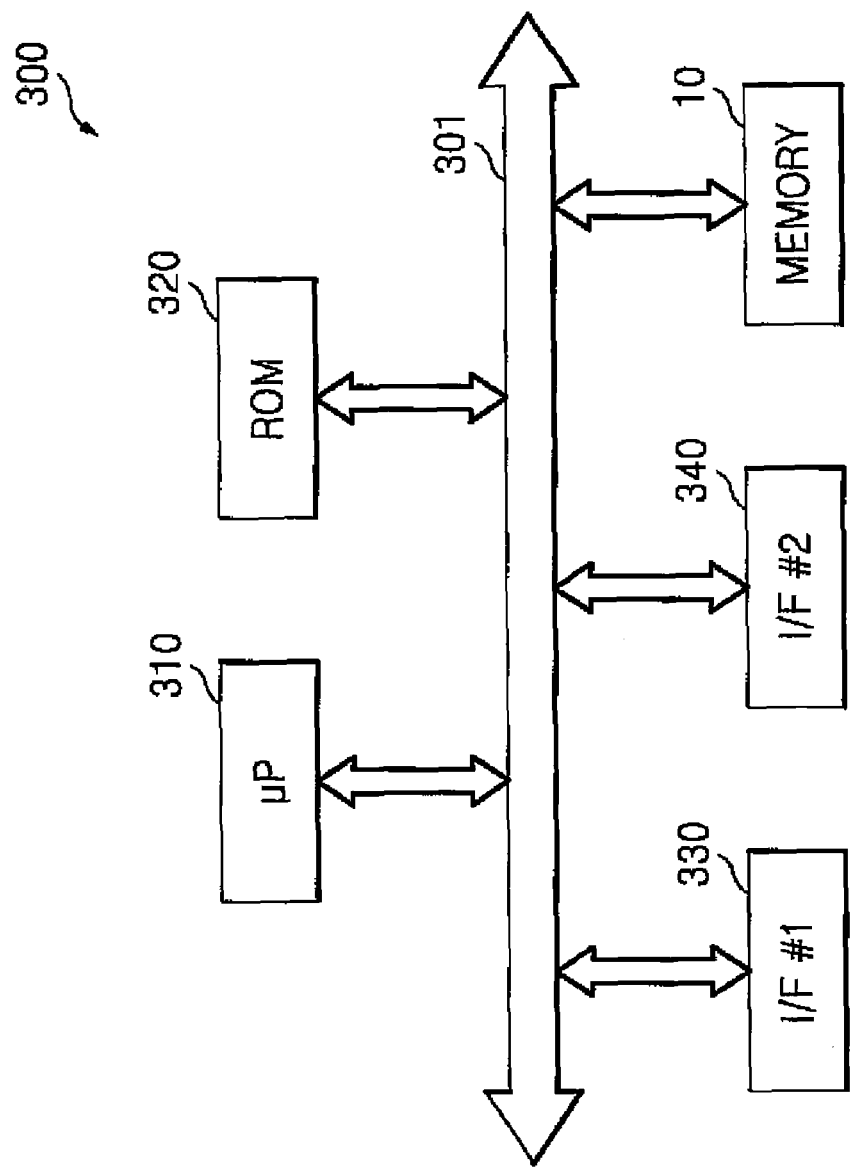
FIG. 6 is a general block diagram of a semiconductor system incorporating the semiconductor device of FIG. 1.

FIG. 6 is a block diagram of a semiconductor system 300 incorporating one or more semiconductor device(s) such as the ones illustrated and described in relation to FIGS. 1-5. Referring to FIG. 6, the semiconductor system 300 including the semiconductor device 10 includes a microprocessor (μP) 310 for controlling the program operation (or write operation) or the read operation of the semiconductor device 10 via a bus 301. The microprocessor 310 may signify a controller capable of controlling the program operation (or write operation) or the read operation of the semiconductor device 10

The semiconductor system 300 may be embodied by a personal computer (PC), a mobile phone or a cellular phone, a smart phone, a memory card, an information technology (IT) terminal, a personal digital assistant (PDA), a portable multimedia player (PMP), a solid state drive (SSD), a digital TV, an e-book, and the like.

The semiconductor system 300 may further include a non-volatile memory, for example, a read only memory (ROM) 320, that may store a program needed for the operation of the microprocessor 310. The semiconductor system 300 may further include a first interface 330 such as a complementary metal-oxide semiconductor (CMOS) image sensor. In this case, the semiconductor system 300 may be embodied by an image pickup apparatus or an image capture apparatus such as a digital camera or a camcorder.

In another exemplary embodiment, the first interface 330 may be, in addition to the image sensor, a display using a thin film transistor liquid crystal display (TFT-LCD), or an organic light emitting diode (OLED), a display using a light-emitting diode (LED), or a display using an active-matrix organic light-emitting diode (AMOLED).

In another exemplary embodiment, the first interface 330 may be a hard disk. In this case, the semiconductor system 300 may be a hard disk drive (HDD). Also, in another exemplary embodiment, the semiconductor system 300 may further include a second interface 340 such as a keyboard, a touch panel, or a mouse. The semiconductor system 300 including the semiconductor device 10 has an effect of improving a write speed because a write operation is performed based on the write time, not based on the number of bits of data to be written.

As described above, in the semiconductor device according to the present inventive concept, since a write operation is performed based on the write time considering a ratio of a set current pulse width and a reset current pulse width, and not only based on the number of bits of data to be written, write speed may be improved.

While the inventive concept has been particularly shown and described with reference to exemplary embodiments thereof, it will be understood that various changes in form and details may be made therein without departing from the scope of the following claims.

What is claimed is:

1. A semiconductor device comprising:
   phase-change memory cells arranged in a memory cell array; and
   an access circuit receiving k bits of read data from the phase-change memory cells and k bits of externally provided write data, and being configured to bitwise compare the write data and read data, wherein each bitwise comparison activates one or more comparison signals respectively indicating one of a plurality of comparison events, and write j bits of write data, where j≦k, to the phase-change memory cells in accordance with a number of the activated comparison signals and a S/N ratio calculated as a ratio between of a set current pulse width and a reset current pulse width applied to the phase-change memory cells.

2. The semiconductor device of claim 1, wherein the access circuit comprises:
   a plurality of comparison units, respectively making a bitwise comparison between a write bit group from the write data and a read bit group from the read data, and activating one or more of the plurality of comparison signals in accordance with the bitwise comparison.

3. The semiconductor device of claim 2, each of the plurality of comparison units comprises:
   a first inverter inverting the write bit group to generate an inverted write bit group;
   an exclusive OR circuit performing an exclusive OR operation on the read bit group and the write bit group to generate an exclusive OR output;
   a second inverter inverting the exclusive OR output to generate an inverted exclusive OR output;
   a first logic circuit comparing the inverted exclusive OR output to the write bit group to generate a first comparison signal;
   a second logic circuit comparing the inverted exclusive OR output to the inverted write bit group to generate a second comparison signal;
   a third logic circuit comparing the exclusive OR output to the write bit group to generate a third comparison signal; and
   a fourth logic circuit comparing the exclusive OR output to the inverted write bit group to generate a fourth comparison signal.

4. The semiconductor device of claim 2, wherein the plurality of comparison units comprises a first, second, third and fourth comparison unit, and the access circuit comprises a decision unit, wherein the decision unit comprises:
   first, second, third, and fourth counters respectively configured to count a number of activated comparison signals provided from the first, second, third and fourth comparison units and generate first, second, third, and fourth count values;
   a first multiplier multiplying the second count value by the S/N ratio to generate a first weighted count value;
   a second multiplier multiplying the third count value by the S/N ratio to generate a second weighted count value;
   a first adder adding the first count value to the first weighted count value to generate a first summed count value;
   a second adder adding the fourth count value to the second weighted count value to generate a second summed count value; and
   a comparator comparing the first and second summed count values to generate a selection signal.

5. The semiconductor device of claim 4, wherein the access circuit further comprises:
   a plurality of write drivers configured to write the k bits of write data to the phase-change memory cells; and
   a plurality of selection blocks, each generating an enable/disable signal applied to a respective one of the plurality of write drivers, wherein j selection block from among the plurality of selection blocks are enabled to write the j bits of write data in response to the number of activated comparison signals, the S/N ratio, and the selection signal.

6. The semiconductor device of claim 5, wherein the access circuit further comprises in association with each one of the plurality of comparison units:
   a first multiplexer providing either the first comparison signal or the second comparison signal in response to the selection signal as a first multiplexer output;
   a second multiplexer providing either the third comparison signal or the fourth comparison signal in response to the selection an output signal of the comparator as a second multiplexer output; and
   a third multiplexer providing either the first multiplexer output or the second multiplexer output as an enable/disable signal applied to a corresponding one of the plurality of write drivers.

7. A semiconductor system comprising:
   a semiconductor device; and
   a processor for outputting write data to the semiconductor device, wherein the semiconductor device comprises:

phase-change memory cells arranged in a memory cell array; and an access circuit receiving k bits of read data from the phase-change memory cells and k bits of externally provided write data, and being configured to bitwise compare the write data and read data, wherein each bitwise comparison activates one or more comparison signals respectively indicating one of a plurality of comparison events, and write j bits of write data, where $j \leq k$, to the phase-change memory cells in accordance with a number of the activated comparison signals and a S/N ratio calculated as a ratio between of a set current pulse width and a reset current pulse width applied to the phase-change memory cells.

8. The semiconductor system of claim 7, wherein the access circuit comprises:

a plurality of comparison units, respectively making a bitwise comparison between a write bit group from the write data and a read bit group from the read data, and activating one or more of the plurality of comparison signals in accordance with the bitwise comparison.

9. The semiconductor system of claim 8, each of the plurality of comparison units comprises:

a first inverter inverting the write bit group to generate an inverted write bit group;

an exclusive OR circuit performing an exclusive OR operation on the read bit group and the write bit group to generate an exclusive OR output;

a second inverter inverting the exclusive OR output to generate an inverted exclusive OR output;

a first logic circuit comparing the inverted exclusive OR output to the write bit group to generate a first comparison signal;

a second logic circuit comparing the inverted exclusive OR output to the inverted write bit group to generate a second comparison signal;

a third logic circuit comparing the exclusive OR output to the write bit group to generate a third comparison signal; and a fourth logic circuit comparing the exclusive OR output to the inverted write bit group to generate a fourth comparison signal.

10. The semiconductor system of claim 8, wherein the plurality of comparison units comprises a first, second, third and fourth comparison unit, and the access circuit comprises a decision unit, wherein the decision unit comprises:

first, second, third, and fourth counters respectively configured to count a number of activated comparison signals provided from the first, second, third and fourth comparison units and generate first, second, third, and fourth count values;

a first multiplier multiplying the second count value by the S/N ratio to generate a first weighted count value;

a second multiplier multiplying the third count value by the S/N ratio to generate a second weighted count value;

a first adder adding the first count value to the first weighted count value to generate a first summed count value;

a second adder adding the fourth count value to the second weighted count value to generate a second summed count value; and a comparator comparing the first and second summed count values to generate a selection signal.

11. The semiconductor system of claim 10, wherein the access circuit further comprises:

a plurality of write drivers configured to write the k bits of write data to the phase-change memory cells; and a plurality of selection blocks, each generating an enable/disable signal applied to a respective one of the plurality of write drivers, wherein j selection block from among the plurality of selection blocks are enabled to write the j bits of write data in response to the number of activated comparison signals, the S/N ratio, and the selection signal.

12. The semiconductor system of claim 11, wherein the access circuit further comprises in association with each one of the plurality of comparison units:

a first multiplexer providing either the first comparison signal or the second comparison signal in response to the selection signal as a first multiplexer output;

a second multiplexer providing either the third comparison signal or the fourth comparison signal in response to the selection an output signal of the comparator as a second multiplexer output; and a third multiplexer providing either the first multiplexer output or the second multiplexer output as an enable/disable signal applied to a corresponding one of the plurality of write drivers.

13. The semiconductor system of claim 7 being a mobile communications apparatus.

14. The semiconductor system of claim 7 being a computer.

15. The semiconductor system of claim 7 being a solid state drive (SSD).

16. A method for operating a semiconductor device, the method comprising:

generating a plurality of bitwise comparison signals indicating different comparison events between respective write bit groups of externally provided write data and read bit groups of read data read from phase-change memory cells; and writing a portion of the write data to some of the phase-change memory cells in accordance with a number of activated comparison signals and a S/N ratio calculated by a ratio of a set current pulse width and a reset current pulse width applied to the phase-change memory cells.

17. The method of claim 16, further comprising:

on the basis of a corresponding plurality of bitwise comparison signals, determining an expected write time for a normal write operation for the write data;

on the basis of a corresponding plurality of bitwise comparison signals, determining an expected write time for an inverted write operation for the write data; and executing either the normal write operation or the inverted write operation on the basis of the respective, expected write times.

* * * * *